(12) United States Patent
Dumbri

(10) Patent No.: US 6,456,101 B2
(45) Date of Patent: *Sep. 24, 2002

(54) CHIP-ON-CHIP TESTING USING BIST

(75) Inventor: Austin C. Dumbri, Easton, PA (US)

(73) Assignee: Agere Systems Guardian Corp., Orlando, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/287,862

(22) Filed: Apr. 7, 1999

(51) Int. Cl.[7] ................... G01R 31/02; G01R 31/28
(52) U.S. Cl. ......................... 324/763; 714/733
(58) Field of Search ................ 324/763, 754, 324/765; 714/7, 718, 719, 720, 723, 724, 727, 728, 733

(56) References Cited

U.S. PATENT DOCUMENTS

| | | | |
|---|---|---|---|
| 4,697,095 A | 9/1987 | Fujii | |
| 4,701,920 A | 10/1987 | Resnick et al. | |
| 4,703,483 A | 10/1987 | Enomoto et al. | |
| 5,138,619 A | 8/1992 | Fasang et al. | |
| 5,872,793 A | 2/1999 | Attaway et al. | |
| 5,987,632 A | * 11/1999 | Irrinki et al. | 714/7 |
| 6,065,134 A | * 5/2000 | Bair et al. | 714/7 |

* cited by examiner

Primary Examiner—N. Le
Assistant Examiner—J Kerveros
(74) Attorney, Agent, or Firm—Synnestvedt & Lechner LLP

(57) ABSTRACT

An auxiliary BIST circuit is constructed in a primary chip to which a secondary chip is attached, thereby allowing testing of the secondary chip using the auxiliary BIST circuit. This allows direct test access to the secondary chip without the need for a separate BIST circuit to be included in the secondary IC chip and without using a primary BIST circuit of the primary IC chip to test the secondary chip.

13 Claims, 1 Drawing Sheet

CHIP-ON-CHIP TESTING USING BIST

FIELD OF THE INVENTION

The present invention relates to a novel and useful method for testing a chip-on-chip semiconductor device and a novel chip-on-chip device which implements this method.

BACKGROUND OF THE INVENTION

In the semi-conductor industry, designers are constantly designing integrated-circuit chips (IC chips) with the goal of decreasing their size and/or "footprint" so that the resulting IC chips can be utilized in smaller devices. Such efforts have resulted in, for example, cellular telephones which can fit in a shirt-pocket and calculators the size of credit cards.

It is customary to test IC chips before they are delivered to a purchaser to insure that the component is defect-free after being manufactured and/or that it remains in proper working condition during use. Such testing can be performed either before the IC chip is mounted into a device or after the chip has been mounted on a printed circuit board.

Testing of an entire IC chip prior to mounting is typically performed using an expensive VLSI test set (e.g., an Advantest Model T3341 VLSI tester) or other known dedicated testing device, using test vectors supplied by the system designer. This testing may be accomplished by applying the test vector to stimulate the inputs of the circuit and by monitoring the output response to detect the occurrence of faults.

Once a chip is mounted, IC chips are typically tested using well-known scan testing methods, although on-board testing using external test devices such as the VLSI test sets described above can also be performed.

Application specific integrated circuits (ASIC's) are IC chips that are designed and built for a specific application. Like most IC chips, ASIC's generally comprise a large number of individual circuit elements, for example, gates and flip-flops. It is common to include a built-in-self-test (BIST) circuit in ASIC's to enable testing of embedded portions of the ASIC (most often embedded memory) after the ASIC has been mounted into a device without requiring the use of external test equipment. Numerous examples of BIST circuits exist; see, for example, U.S. Pat. Nos. 5,872, 793; 5,138,619; and 4,701,920; all of which are incorporated herein by reference.

FIG. 1 illustrates an IC having a BIST circuit built into the IC chip. As shown schematically in FIG. 1, a printed circuit board 12 has a plurality of solder pads 14 formed thereon. An IC chip 16 (e.g., an ASIC) is mounted via wire bond leads 14 and 18. Typically, the leads 14 and 18 are connected via wire to form electrical connections there between. A BIST circuit 17, formed as part of the IC chip 16, provides for testing of portions of the IC chip 16 in a well known manner.

One development that has significantly reduced the size of devices containing IC chips is "chip-on-chip" technology (see, for example, U.S. Pat. No. 4,703,483, incorporated herein by reference). In the most general sense, chip-on-chip technology refers to the physical mounting of one chip atop another. Referring to FIG. 2, in a typical configuration, the IC chip 16 (referred to herein as the "primary chip") of FIG. 1 includes leads 20 formed thereon to provide points for connection to a second chip 22 (referred to herein as the "secondary chip") having leads 24 formed on its underside. The configuration illustrated in FIG. 2 results in a reduction of the footprint of the combined chips (i.e., secondary chip 22 does not take up any space on the printed circuit board 12). For the purpose of simplicity the physical connection of the chips to each other and to the printed circuit board are illustrated as solder pad/solder joint connections. In practice, these connections could be made using any known method for attaching chips to each other or to a printed circuit board.

Certain problems exist when it comes to testing a chip-on-chip device. When two chips are stacked as shown in FIG. 2, a standard testing device or testing system can only be used with great difficulty. For example, to test secondary chip 22 using an external testing device, it must be accessed via the electrical connections of primary chip 16. The test equipment must "navigate" through the logic of the primary chip 16 to get to the secondary chip 22. Thus, test vectors need to be written which will function on secondary chip 22 taking into account the circuitry of primary chip 16. Likewise, if the primary IC chip 16 is equipped with BIST as shown in FIG. 2, the BIST circuit must be able to perform the testing of the secondary IC chip 22 in addition to the testing of the portions of primary IC chip 16 that require BIST testing. These requirements are quite complicated and time-consuming to achieve, and require a great deal of effort on the part of the IC chip designer.

SUMMARY OF THE INVENTION

The present invention provides an improved method and apparatus for testing chip-on-chip semi-conductor devices. The invention accomplishes this objective by the inclusion of an auxiliary BIST circuit in the primary chip to which the secondary chip is attached, thereby allowing testing of the secondary chip using the auxiliary BIST circuit.

In a preferred embodiment the present invention comprises an integrated circuit having a primary IC chip and a secondary IC chip electrically connected to each other, the primary IC including an auxiliary BIST circuit for testing the secondary IC. The primary IC chip may further include a primary BIST circuit for testing of portions of the primary IC chip.

DETAILED DESCRIPTION OF THE PREFERRED EMBODIMENT

Figure 1:
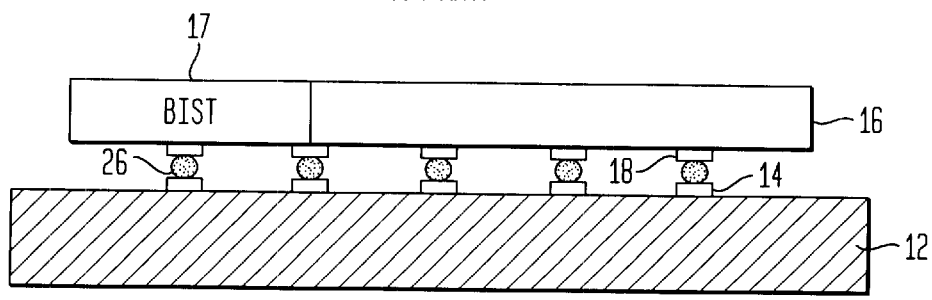
FIG. 1 is a side view of a prior art single-chip semiconductor device.
Figure 2:
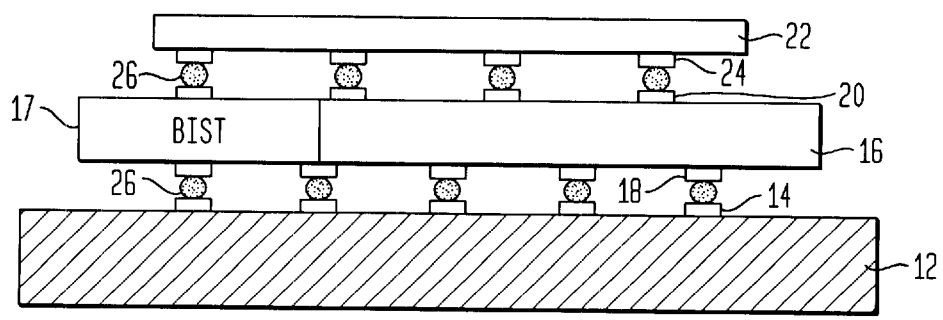
FIG. 2 is a side view of a prior art chip-on-chip semiconductor device.
Figure 3:
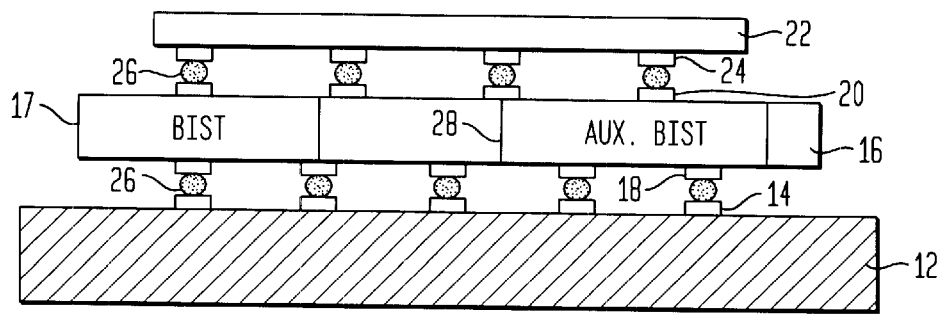
FIG. 3 is a side view of an embodiment of a semiconductor device in accordance with the present invention.

Referring to FIG. 3, an auxiliary BIST circuit 28 is designed into the primary IC chip 16 as shown. The auxiliary BIST circuit 28 provides for direct testing of the secondary IC chip 22 without the problems inherent in trying to test the memory through the primary IC chip 16 using an external test device or with trying to utilize the existing BIST circuit 17 to test both IC chips. Thus, the auxiliary BIST circuit can be designed to function in accordance with the specific requirements of secondary IC chip 22 during the design of primary chip 16. When the two IC chips are mated together, each has its own dedicated BIST circuit, avoiding the need to modify existing BIST circuit 17 to accommodate the test needs of secondary IC chip 22.

Many different tests can be performed using a typical BIST circuit. A testing algorithm is synthesized into logic on the integrated circuit. As is well known, the heart of a BIST circuit is the state machine which is basically logic that "knows" where in the test sequence the test has progressed and controls other logic so that the BIST circuit is doing the proper test of the BISTed portion of the chip. For example, a memory portion of a chip may be tested using an input clock (either supplied externally or from a phase-lock loop) and a binary counter that has more bits (output) than the input address field. The extra outputs are used to control other things such as data-in, read/write, etc.

Next, a simple up-march pattern is implemented so that each address, starting from the lowest to the highest, is incrementally written and then the entire memory is read. By writing and then reading each address in the memory chip, it is possible to determine if the chip is functioning properly. Obviously, this is only one example of the type of tests that are performed using BIST; the present invention is not directed to any specific type of BIST, but is instead directed to the inclusion of an auxiliary BIST circuit on a primary chip to test a secondary chip attached thereto.

In the preferred embodiment described above, the auxiliary BIST circuit 17 is designed to function in accordance with the specific requirements of secondary IC chip 22. However, in accordance with known methods, a programmable BIST circuit could instead be used for BIST circuit 17 so that several different memory chips could be selected for use as the secondary IC chip 22.

Auxiliary BIST circuit 28 can comprise any known BIST circuit or an equivalent thereof; the exact structure of the BIST circuit utilized does not constitute part of the invention. In view of the disclosure herein of the inventive concept, it is within the skill of a practitioner in the field of integrated circuit chip design to, instead of routing the test circuitry of auxiliary BIST circuit 28 to test the circuitry of the chip on which it resides (primary IC chip 16 in FIG. 3), design auxiliary BIST circuit 28 so that it can "communicate" with secondary IC chip 22 directly via leads 20 and 24. This eliminates the need to multiplex the memory I/O to the package pins (or bond pads) and eliminates the need to use an expensive memory or VLSI tester.

Numerous variations of the above-described IC chip are possible. For example, the secondary IC chip 22 can be a DRAM, SRAM, FLASH, or any other type of memory. Further, in addition to ASIC's, the primary IC chip 16 can be a DSP or other standard chip. Further, if the secondary IC chip 22 is physically larger than the primary IC chip 16, the primary chip 16 can be mounted on the secondary IC chip 22 instead of vice versa as shown.

In addition, while in the preferred embodiment the auxiliary BIST circuit is used to test a secondary IC chip which is in a chip-on-chip configuration with respect to a primary IC chip, the present invention is considered to cover an arrangement wherein the primary and secondary IC chips are physically separate with respect to each other but are linked electrically to enable the testing of the secondary IC chip using the auxiliary BIST circuit.

While there has been described herein the principles of the invention, it is to be understood by those skilled in the art that this description is made only by way of example and not as a limitation to the scope of the invention. Accordingly, it is intended by the appended claims, to cover all modifications of the invention which fall within the true spirit and scope of the invention.

I claim:

1. An integrated circuit, having a primary IC chip having an upper planar surface with connection leads formed thereon, and a secondary IC chip having a lower planar surface with connection leads formed thereon, said primary IC chip and said secondary IC chip being electrically connected to each other via their respective connection leads, said primary IC comprising:

an auxiliary built-in-self-test (BIST) circuit configured for testing only said secondary IC.

2. An integrated circuit as set forth in claim 1, wherein said primary IC further comprises:

a primary BIST circuit for testing portions of said primary IC.

3. An integrated circuit as set forth in claim 1, wherein said primary IC chip is an ASIC.

4. An integrated circuit as set forth in claim 1, wherein said primary IC chip is a digital signal processor (DSP).

5. An integrated circuit as set forth in claim 1, wherein said secondary IC chip is a memory chip.

6. An integrated circuit as set forth in claim 1, wherein said secondary IC chip is a DRAM.

7. An integrated circuit as set forth in claim 1, wherein said secondary IC chip is an SRAM.

8. An integrated circuit as set forth in claim 1, wherein said secondary IC chip is a nonvolatile memory.

9. An integrated circuit as set forth in claim 8, wherein said nonvolatile memory comprises a FLASH memory.

10. An integrated circuit as set forth in claim 1, wherein said primary IC chip and said secondary IC chip are physically connected in a chip-on-chip configuration.

11. A method of testing a secondary IC chip electrically connected to a primary IC chip, said primary IC chip having an upper planar surface with connection leads formed thereon, said secondary IC chip having a lower planar surface with connection leads formed thereon, said electrical connection between said primary and said secondary IC chips being formed by an electrical connection between their respective connection leads, said method comprising the steps of:

providing said primary IC chip with an auxiliary built-in-self-test (BIST) circuit configured for testing only said secondary IC chip; and testing said secondary IC chip using said auxiliary BIST circuit.

12. An auxiliary built-in-self-test (BIST) circuit in a primary integrated circuit (IC) chip, said primary IC chip having an upper planar surface with connection leads formed thereon, and a secondary IC chip having a lower planar surface with connection leads formed thereon, said primary IC chip and said secondary IC chip being electrically connected to each other via their respective connection leads, said BIST circuit adapted to test only said secondary IC chip.

13. An auxiliary BIST circuit as set forth in claim 12, wherein said primary and secondary IC's are coupled in a chip-on-chip configuration.

* * * * *